United States Patent [19]

Valdettaro

[11] 3,844,176

[45] Oct. 29, 1974

[54] SHAFT MOUNTING ARRANGEMENT FOR UHF TUNERS

[75] Inventor: Alarico A. Valdettaro, Bloomington, Ind.

[73] Assignee: Sarkes Tarzian, Inc., Bloomington, Ind.

[22] Filed: May 24, 1973

[21] Appl. No.: 363,588

[52] U.S. Cl. ................................ 74/10.41, 74/10.54

[51] Int. Cl. ....... F16h 35/18, H03j 1/12, H03j 1/14

[58] Field of Search .............. 74/10.41, 10.5, 10.52, 74/10.54

[56] References Cited

UNITED STATES PATENTS 3,774,459 11/1973 Valdettaro ......................... 74/10.41

*Primary Examiner*—Allan D. Herrmann

*Attorney, Agent, or Firm*—Mason, Kolehmainen, Rathburn & Wyss

[57] ABSTRACT

Undesired creep between the input station selector shaft of a seventy position detent UHF tuner and the drive pinion connected to the rotor shaft of the tuner is avoided by employing a spacer member between the selector shaft and an internal fine tuning shaft. The spacer holds the selector shaft and fine tuning shaft in exact coaxial alignment against the lateral thrust exerted by the detent spring and permits relatively tolerances or play between the two shafts without producing an undesired creeping action of the drive pinion as the selector shaft is rotated.

5 Claims, 4 Drawing Figures

SHAFT MOUNTING ARRANGEMENT FOR UHF TUNERS

The present invention relates to UHF tuners, and more particularly, to UHF tuners of the type which are arranged to provide a separately detented position of the selector shaft for each of the seventy UHF stations in the UHF television band.

Various arrangements have been heretofore proposed in conjunction with a UHF tuner of the continuously variable type to provide a separately detented position for the selector shaft of the UHF tuner for each one of the seventy UHF stations in the UHF television band. One such arrangement is shown, for example, in copending Valdettaro application Ser. No. 233,148 filed Mar. 9, 1972, now U.S. Pat. No. 3,774,459. In said copending Valdettaro application the selector shaft is mounted in the forward wall of a main mounting bracket, and the fine tuning shaft, which is positioned inside the station selector shaft, is mounted on a rear wall of the main mounting bracket. The detent positions are established by means of a detent spring which engages detent lobes formed integrally with the selector shaft at a point intermediate the two supporting walls of the bracket. This detent spring exerts a side thrust on the rear end of the selector which is supported indirectly through the central fine tuning shaft. While such an arrangement is in general satisfactory for its intended purpose, it has been found if a large tolerance is employed between the station selector shaft and the central fine tuning shaft, the side thrust exerted by the detent spring on the rear end of the selector shaft causes the selector shaft to be slightly eccentric with respect to the fine tuning shaft and the clutch plate carried thereby.

Under these conditions an action which may be termed "creep" is produced when the selector shaft is rotated through a number of revolutions as it is when traveling from one end to the UHF television band to the other. This "creep" between the selector shaft and the output pinion which is carried by and secured to the fine tuning shaft affects the overall alignment accuracy curve of the UHF tuner since the pinion connected to the fine tuning shaft drives the rotor of the continuously variable UHF tuner through a spring loaded gear train. This creep effect may become even more objectionable in the future when the FCC requirements are tightened from the present limitation of plus or minus three megacycles over the entire UHF band to a limitation of plus or minus one megacycle throughout the UHF band. These requirements are presently set to be enforced in 1975.

It is, therefore, a primary object of the present invention to provide a new and improved shaft mounting arrangement for a seventy position detented UHF tuner which positively eliminates creep between the selector shaft and the fine tuning shaft during the selection of UHF stations throughout the UHF band.

It is a further object of the present invention, to provide a new and improved shaft mounting arrangement for a UHF tuner wherein a substantial amount of play can be tolerated between the central fine tuning shaft and its surrounding station selector shaft while eliminating creep between these two shafts.

Briefly considered, in accordance with the present invention, the side thrust exerted by the detent spring on the rear end of the selector shaft is prevented from tilting the selector shaft with respect to the fine tuning shaft by providing a low friction plastic washer which has an inner diameter closely fitting with the fine tuning shaft and an outer diameter closely fitting with the selector shaft. This washer is positioned in the vicinity of the detent spring so that it absorbs the side thrust and transmits it to the central fine tuning shaft without permitting the selector shaft to become tilted with respect to the fine tuning shaft. As a result, the creep effect described above is substantially eliminated while permitting relatively large tolerances to be employed between the central fine tuning shaft and the concentric selector shaft.

The invention, both as to its organization and method of operation, together with further objects and advantages thereof, will best be understood by reference to the following specification taken in connection with the accompanying drawings in which.

Figures 1, 2:
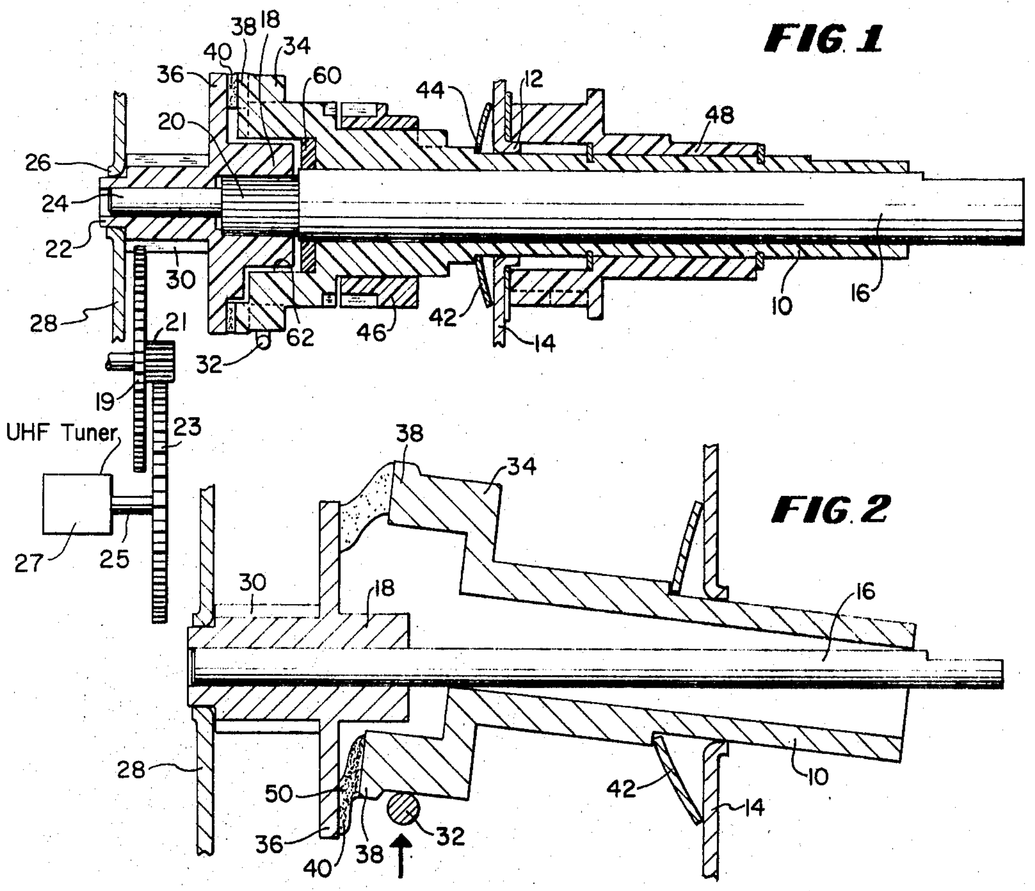
FIG. 1 is a cross sectional view of a tuner shaft mounting arrangement in accordance with the present invention.
FIG. 2 is a diagrammatic illustration of the effect of play between the fine tuning and station selector shaft in producing creep action.
Figure 3:
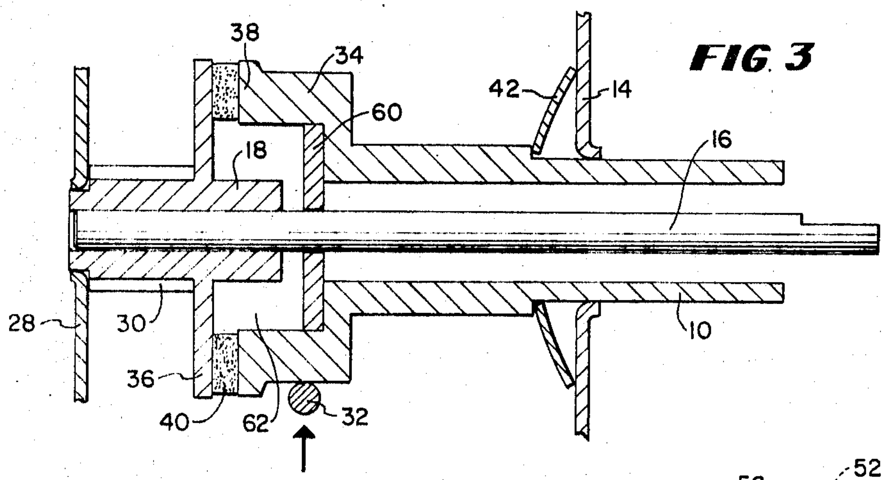
FIG. 3 is a diagrammatic view similar to FIG. 2 but illustrating the manner in which the low friction plastic washer of the present invention prevents such creep action.

Referring now to the drawings and more particularly to FIG. 1 thereof, the selector shaft of the seventy position detent UHF tuner is shown therein as the shaft 10 which is journaled in the opening formed by a forwardly directed flange portion 12 of a front mounting bracket 14 of the tuner drive mechanism. A fine tuning shaft 16 is positioned inside the selector shaft 10 and a hub member 18 is secured to the knurled end portion 20 of the fine tuning shaft 16. The hub member 18 is provided with a tubular end bearing portion 22 which fits over the extreme end portion 24 of the fine shaft 16 and is journaled in the opening formed by a rearwardly extending flange 26 formed in the rear wall 28 of the tuner drive mechanism main bracket. An output drive pinion 30 is formed integrally with the hub member 18 and is connected by means of suitable gearing 19, 21 and 23 to the main tuning shaft 25 of a continuously variable UHF tuner 27.

The selector shaft 10 is detented by means of a detent spring the V-shaped end portion 32 of which engages the lobes of a detent wheel formed in the outwardly extending flange portion 34 at the rear end of the selector shaft 10. As viewed in FIG. 1, the detent spring 32 thus exerts a sidewise or lateral thrust on the rear end of the selector shaft 10 as will be described in more detail hereinafter.

In order to drive the pinion 30 from the selector shaft 10, the hub member 18 is provided with an outwardly extending flange portion 36 the forward face of which acts as a first clutch plate having an annular surface which extends close to the rear face portion 38 of the selector shaft 10. The face portion 38 acts as a second clutch plate having an annular surface and a clutch pad 40 is provided between the two annular surfaces defined by the opposed portions of the members 36 and 38. A bowed spring washer 42 is positioned between the front bracket wall 14 and a shoulder 44 formed in the selector shaft 10 so that a rearward force is exerted on the selector shaft which provides sufficient force that rotation of the selector shaft 10 is transmitted through the clutch pad to the flange 36 and hence to the output pinion 30. In this connection it will be noted that the washer 42 also urges the hub member 18 against the rear wall 28 of the main mounting bracket.

The arrangement described thus far is identical to that described in detail in copending Valdettaro application Ser. No. 233,148, now U.S. Pat. No. 3,774,459, and reference may be had to said copending Valdettaro application for a complete and detailed description of the functioning of the tuner drive mechanism in relation to the continuously variable UHF tuner. However, for the purposes of the present invention, it may be stated generally that each one of the seventy UHF channels is individually selected by manipulation of the selector shaft 10 through approximately seven revolutions, ten such UHF stations being selected per revolution of the shaft 10. The selector shaft 10 is thus detented at ten different equally spaced positions by means of the detent lobe 34 and the detent spring 32 so that the selector shaft 10 may be used directly as a units dial drive member while at the same time functioning as a station selector member. A counter mechanism is employed, which includes the member 46 which is rotatably positioned on the selector shaft 10, the member 46 being employed to move a tens dial sleeve member 48 one increment for each revolution of the selector shaft 10 so that the tens dial sleeve 48 may be employed directly as a decade dial drive member, the units and tens digit dial members forming a composite display indicating digitally the channel number assigned to each UHF station selected by manipulation of the UHF selector shaft 10. In any detented UHF position, the fine tuning shaft 16 may be rotated independently of the selector shaft 10 through a limited arc by means of a knob secured to the end of the shaft 16, the clutch formed by the members 36, 38 and 40 slipping during this fine tuning operation.

In order to understand how a so-called creep action can occur in the arrangement described thus far, reference may be had to FIG. 2 of the drawings wherein a simplified diagrammatic illustration of the relationship between the selector shaft 10 and the fine tuning shaft 16 is shown with the play between these members greatly exaggerated. In this figure it will be seen that the side thrust exerted by the detent spring 32 has shifted the rear end of the selector shaft 10 laterally by a substantial amount so that the axis of rotation of this selector shaft is not coincident with the axis of rotation of the fine tuning shaft 16. The effect of this tilting or twisting of the selector shaft under the side thrust of the detent spring 32 is that the hub member 18 is effectively driven through the clutch pad 40 at the point 50 in FIG. 2, i.e., the point at which the members 36 and 38 are in closest relationship. When the hub member 18 is thus driven from the point 50, the output pinion 30 advances faster than the selector shaft 10 is rotated. This may be readily seen from an examination of FIG. 4 wherein the point of contact between the members 36 and 38 is shown as the point 50, the path of a corresponding point on the flange numbered 36 is shown as the circle 52 and the path of the outer edge portion of the selector shaft is shown as the circle 54, it being noted that the center of the circle 54, i.e., the point 58, which represents movement of the selector shaft 10, is offset laterally from the point 56 forming the center of the axis of rotation of the hub member 18. In this connection, it will be understood that the two members 36 and 38 remain in contact at the point 50 as the selector shaft 10 is rotated due to the resiliency of the clutch 40, the lateral shifting of this clutch pad being greatly exaggerated in FIG. 2.

Figure 4:
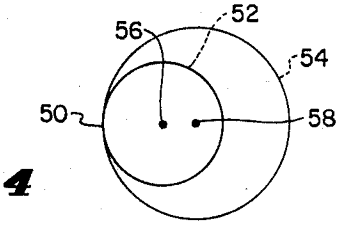
FIG. 4 is a diagrammatic view illustrating the creep action between the selector and fine tuning shafts in the arrangement of FIG. 2.

From FIG. 4 it will be evident that one full revolution of the selector shaft along the circle 54 will produce somewhat more than one revolution of the member 36 along the path 52 and hence somewhat more than one revolution of the output pinion 30. In this connection it will be understood that the play between the shafts 10 and 16 is greatly exaggerated in FIG. 2. However, when only a few thousandths of play is present between these shafts, it has been found that the output pinion 30 will advance by a degree or more for each revolution of the selector shaft 10. The disadvantages of such an arrangement have been discussed in detail heretofore.

In accordance with the present invention, a substantial amount of play between the selector shaft 10 and the fine tuning shaft 16 can be accomplished while completing eliminating creep between these members when the selector shaft is rotated through a number of revolutions by providing a washer 60 made of low friction plastic material. The washer 60 has an internal diameter closely fitting the diameter of the fine tuning shaft 16 and in fact may be press fitted onto the fine tuning shaft 16 if desired. The outer periphery of the washer 16 is formed so that it will fit into the rearwardly opening recess 62 formed in the end of the selector shaft 10. Preferably the washer 60 is also press fitted into the recess 62 so that substantially no play exists between the shafts 10 and 16 in the vicinity of the lateral thrust exerted by the detent spring 32. By virtue of the washer 60 which holds the shaft 10 and 16 in exact coaxial alignment in the vicinity of the clutch plate 40, the selector shaft 10 may be rotated through a member of revolutions and such motion will be faithfully reproduced in the motion of the pinion 30 without any creep or advancing action with respect to the selector shaft 10. In this connection it will be noted that whereas a press fit is employed between the washer 60 and the fine tuning shaft 16, this shaft may be rotated relative to the selector shaft to effect a fine tuning operation due to the low friction plastic nature of the material employed for the washer 60. Also a substantial tolerance or play between the shafts 10 and 16 can be tolerated in the arrangement of the present invention so that relatively inexpensive members may be employed for these shafts.

While there has been illustrated and described a single embodiment of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. The combination of, a UHF tuner having a continuously variable main tuning shaft rotation of which is effective selectively to receive signals from all television stations in the UHF television band, a selector shaft, a detent wheel secured to said selector shaft and having indentations in the periphery thereof, spring biased detent means adapted to engage the indentations of said wheel as said selector shaft is rotated thereby to establish different equally spaced detent positions for said selector shaft, a fine tuning shaft positioned inside said selector shaft, a first gear secured to and rotatable with said fine tuning shaft, means including gear means for interconnecting said first gear and said main tuning shaft, a first clutch plate secured to and rotatable with said fine tuning shaft and having a first annular surface, a second clutch plate secured to and rotatable with said selector shaft and having a second annular surface in alignment with said first surface, a clutch pad positioned between said first and second annular surfaces, means for exerting a force along the axes of said shafts tending to bias said annular surfaces into engagement with opposite sides of said clutch pad, said detent means exerting a side thrust on said selector shaft which tends to misalign said selector shaft with respect to said fine tuning shaft and produce undesired relative movement between said first and second surfaces as said selector shaft is rotated, and means for positively preventing misalignment of said selector shaft relative to said fine tuning shaft due to said side thrust while permitting rotation of said fine tuning shaft independently of said selector shaft when said selected shaft is restrained by said detent means.

2. The combination of claim 1, wherein said last named means comprises a washer positioned between said selector shaft and said fine tuning shaft and having an inside diameter closely fitting with said fine tuning shaft and an outside diameter closely fitting with said selector shaft.

3. The combination of claim 2, wherein said selector shaft has a recess in an end thereof and said washer is positioned in said recess said outside diameter in engagement with the wall of said recess.

4. The combination of claim 1, wherein said first clutch plate and said first gear form an integral hub member which is secured to said fine tuning shaft, said hub member is provided with an end bearing portion, and a fixed support for said end bearing portion, said clutch biasing means also exerting a force tending to hold said end bearing portion against said support.

5. The combination of claim 4, wherein said clutch biasing means comprises a cup-shaped spring washer positioned between a fixed support and a shoulder on said selector shaft and exerting a rearwardly directed force on said selector shaft.

* * * * *